(12) United States Patent
Im et al.

(10) Patent No.: US 7,923,811 B1
(45) Date of Patent: Apr. 12, 2011

(54) ELECTRONIC FUSE CELL WITH ENHANCED THERMAL GRADIENT

(75) Inventors: Hsung Jai Im, Cupertino, CA (US); Sunhom Paak, San Jose, CA (US); Boon Yong Ang, Santa Clara, CA (US)

(73) Assignee: Xilinx, Inc., San Jose, CA (US)

( * ) Notice: Subject to any disclaimer, the term of this patent is extended or adjusted under 35 U.S.C. 154(b) by 65 days.

(21) Appl. No.: 12/043,910

(22) Filed: Mar. 6, 2008

(51) Int. Cl.
H01L 23/52 (2006.01)
(52) U.S. Cl. .................. 257/529; 257/209; 257/530
(58) Field of Classification Search .............. 257/529, 257/530
See application file for complete search history.

(56) References Cited

U.S. PATENT DOCUMENTS

| | | |
|---|---|---|
| 4,219,836 A | 8/1980 | McElroy |
| 4,238,839 A | 12/1980 | Redfern et al. |
| 4,562,454 A * | 12/1985 | Schultz et al. ............... 257/529 |
| 4,647,340 A | 3/1987 | Szluk et al. |
| 4,872,140 A | 10/1989 | Graham et al. |
| 5,166,758 A | 11/1992 | Ovshinsky et al. |
| 5,708,291 A | 1/1998 | Bohr et al. |
| 5,742,555 A | 4/1998 | Marr et al. |
| 5,874,851 A | 2/1999 | Shiota |
| 6,060,743 A | 5/2000 | Sugiyama et al. |
| 6,258,700 B1 | 7/2001 | Bohr et al. |
| 6,368,902 B1 | 4/2002 | Kothandaraman et al. |
| 6,496,416 B1 | 12/2002 | Look |
| 6,522,582 B1 | 2/2003 | Rao et al. |
| 6,525,397 B1 | 2/2003 | Kalnitsky et al. |
| 6,597,013 B2 | 7/2003 | Romas, Jr. et al. |
| 6,621,095 B2 * | 9/2003 | Chiang et al. .................. 257/5 |
| 6,671,205 B2 | 12/2003 | Look |
| 6,703,680 B2 * | 3/2004 | Toyoshima ................ 257/529 |
| 6,804,159 B2 | 10/2004 | Kamiya et al. |
| 6,807,079 B2 | 10/2004 | Mei et al. |
| 6,882,571 B1 | 4/2005 | Look |
| 6,911,360 B2 | 6/2005 | Li et al. |
| 6,930,920 B1 | 8/2005 | Look |
| 6,936,527 B1 * | 8/2005 | Look ........................ 438/542 |
| 7,026,692 B1 | 4/2006 | Look |
| 7,068,072 B2 | 6/2006 | New et al. |
| 7,092,273 B2 | 8/2006 | Look |
| 7,098,721 B2 | 8/2006 | Ouellette et al. |

(Continued)

FOREIGN PATENT DOCUMENTS

EP 0 161 947 A 11/1985

(Continued)

OTHER PUBLICATIONS

Toyoji Yamamoto et al., "Bias Temperature Instability in Scaled p+ Polysilicon Gate p-MOSFET's," IEEE Transactions on Electron Devices, vol. 46, No. 5, May 1999, IEEE, 3 Park Avenue, 17th Floor, New York, NY 10016-5997.

(Continued)

Primary Examiner — Marcos D Pizarro
Assistant Examiner — Raj Gupta
(74) Attorney, Agent, or Firm — Scott Hewett

(57) ABSTRACT

An electronic fuse ("E-fuse") cell is formed on a semiconductor substrate. The E-fuse cell has a fuse element with a fuse link extending from a first fuse terminal across a thick dielectric structure to a second fuse terminal. The first and second fuse terminals are separated from the semiconductor substrate by a thin dielectric layer.

20 Claims, 4 Drawing Sheets

U.S. PATENT DOCUMENTS

| | | | |
|---|---|---|---|
| 7,180,102 | B2 | 2/2007 | Hui |
| 7,224,633 | B1 | 5/2007 | Hovis et al. |
| 2004/0004268 | A1 | 1/2004 | Brown et al. |
| 2004/0124458 | A1 | 7/2004 | Kothandaraman |
| 2005/0247997 | A1 | 11/2005 | Chung et al. |
| 2005/0280083 | A1 | 12/2005 | Vogelsang |
| 2006/0134839 | A1* | 6/2006 | Look .............................. 438/132 |
| 2006/0237818 | A1* | 10/2006 | Chang ............................ 257/529 |
| 2007/0063313 | A1* | 3/2007 | Barth et al. .................... 257/529 |
| 2007/0222027 | A1* | 9/2007 | Yang et al. ..................... 257/529 |
| 2009/0003028 | A1* | 1/2009 | Keshavarzi et al. ............. 365/96 |

FOREIGN PATENT DOCUMENTS

| | | |
|---|---|---|
| JP | 2007 042780 A | 2/2007 |
| JP | 2007 194377 A | 8/2007 |

OTHER PUBLICATIONS

Se-Aug Jang et al., "Effects of Thermal Processes After Silicidation on the Performance of TiSi2/Polysilicon Gate Device," IEEE Transactions on Electron Devices, vol. 46, No. 12, Dec. 1999, pp. 2353-2356, IEEE, 3 Park Avenue, 17th Floor, New York, NY 10016-5997.

Rahman, Arifur et al., "Die Stacking Technology for Terabit Chip-to-Chip Communications", Proceedings of 2006 IEEE Custom Integrated Circuits Conference (CICC), Sep. 10-13, 2006, available from IEEE, 3 Park Avenue, 17th Floor, New York, NY 10016-5997.

N. Kimizuka et al., "NBTI enchancement by nitrogen incorporation into ultrathin gat oxide for 0.10-um gate CMOS generation," 2000 Symposium on VLSI Technology Digest of Technical Papers, Apr. 2000, pp. 92-93, IEEE, 3 Park Avenue, 17th Floor, New York, NY 10016-5997.

Mohsen Alavi et al., A Prom Element Based on Salicide Agglomeration of Poly Fuses in a CMOS Logic Process, Jul. 1997, pp. 855-858, IEEE, 3 Park Avenue, 17th Floor, New York, NY 10016-5997.

Jerome B. Lasky et al., "Comparison of Transformation to Low-Resistivity Phase and Agglomeration of TiSi2 and CoSi2," IEEE Transactions on Electron Devices, vol. 38, No. 2, Feb. 1991, pp. 262-269, IEEE, 3 Park Avenue, 17th Floor, New York, NY 10016-5997.

Alexander Kalnitzky et al., CoSi2 integrated fuses on poly silicon for low voltage 0.18um CMOS applications, Sep. 1999, pp. 765-768 IEEE, 3 Park Avenue, 17th Floor, New York, NY 10016-5997.

U.S. Appl. No. 12/043,103, filed Mar. 5, 2008, Im, Hsung Jai, et al., Xilinx, Inc. 2100 Logic Drive, San Jose, CA 95124.

U.S. Appl. No. 12/043,091, filed Mar. 5, 2008, Im, Hsung Jai, et al., Xilinx, Inc. 2100 Logic Drive, San Jose, CA 95124.

U.S. Appl. No. 12/043,099, filed Mar. 5, 2008, Im, Hsung Jai et al., Xilinx, Inc. 2100 Logic Drive, San Jose, CA 95124.

U.S. Appl. No. 11/973,062, filed Oct. 4, 2007, Rahman, Arifur et al., Xilinx, Inc. 2100 Logic Drive, San Jose, CA 95124.

U.S. Appl. No. 11/717,836, filed Mar. 13, 2007, Oh, Kwansuhk, et al., Xilinx, Inc. 2100 Logic Drive, San Jose, CA 95124.

U.S. Appl. No. 11/588,775, filed Oct. 27, 2006, Paak, Sunhom et al., Xilinx, Inc. 2100 Logic Drive, San Jose, CA 95124.

U.S. Appl. No. 11/449,171, filed Jun. 8, 2006, Ang, Boon Yong et al., Xilinx, Inc. 2100 Logic Drive, San Jose, CA 95124.

U.S. Appl. No. 12/043,914, filed Mar. 6, 2008, Im, Hsung Jai, et al., Xilinx, Inc. 2100 Logic Drive, San Jose, CA 95124.

U.S. Appl. No. 11/799,886, filed May 2, 2007, Sidhu, Lakhbeer S. et al., Xilinx, Inc. 2100 Logic Drive, San Jose, CA 95124.

* cited by examiner

ELECTRONIC FUSE CELL WITH ENHANCED THERMAL GRADIENT

FIELD OF THE INVENTION

This invention relates generally to integrated circuits ("ICs"), and more particularly to an electronic fuse ("E-fuse") cell used to store non-volatile data in an IC.

BACKGROUND OF THE INVENTION

Many ICs are made up of millions of interconnected devices, such as transistors, resistors, capacitors, and diodes, on a single chip of semiconductor substrate. It is generally desirable that ICs operate as fast as possible, and consume as little power as possible. Semiconductor ICs often include one or more types of memory, such as CMOS memory, antifuse memory, and E-fuse memory.

One-time-programmable ("OTP") memory elements are used in ICs to provide non-volatile memory ("NVM"). Data in NVM are not lost when the IC is turned off. NVM allows an IC manufacturer to store lot number and security data on the IC, for example, and is useful in many other applications. One type of NVM is commonly called an E-fuse.

E-fuses are usually integrated into semiconductor ICs by using a narrow stripe (commonly also called a "fuse link") of conducting material (metal, poly-silicon, etc.) between two pads, generally referred to as anode and cathode. Applying a programming current ($I_{prog}$) to the E-fuse destroys (fuses) the link, thus changing the resistance of the E-fuse. This is commonly referred to as "programming" the E-fuse. The fuse state (i.e., whether it has been programmed) can be read using a sense circuit, which is common in the art of electronic memories.

FIG. 1A is a plan view of an E-fuse element 100. The E-fuse 100 has a fuse link 102 between an anode 104 and a cathode 106. The anode, fuse link, and cathode are typically polysilicon or silicided polysilicon formed entirely on relatively thick field oxide or isolation oxide. Contacts (not shown) provide electrical terminals to the anode and cathode. The fuse link has a fuse link length $FL_L$ and a fuse link width $FL_W$. The fuse link has a relatively small cross section, which is essentially defined by the thickness of the material in which the fuse link is formed in and by the fuse link width. The fuse link width $FL_W$ is often the critical dimension (e.g., minimum polysilicon dimension) of the technology used to fabricate the IC. The small cross section of the fuse link results in Joule heating of the link during programming to convert the E-fuse to a high resistance state.

The terms "anode" and "cathode" are used for purposes of convenient discussion. Whether a terminal of an E-fuse operates as an anode or a cathode depends upon how the programming current is applied. Programming of the E-fuse can be facilitated by the physical layout. For example, the cathode 106 is larger than the fuse link 102, which generates localized Joule heating in the fuse link during programming.

During programming, current is applied through the fuse link for a specified period. The programming current heats up the fuse link more than the adjacent areas due to current crowding and differences in heat dissipation, creating a temperature gradient. The temperature gradient and the carrier flux causes electro- and stress-migration to take place and drive material (e.g., silicide, dopant, and polysilicon) away from the fuse link.

Programming generally converts the E-fuse from an original resistance to a programmed resistance. It is desirable for the programmed resistance to be much higher (typically many orders of magnitude higher) than the original resistance to allow reliable reading of the E-fuse using a sensing circuit. A first logic state (e.g., a logical "0") is typically assigned to an unprogrammed, low-resistance (typically about 200 Ohms) fuse state, and a second logic state (e.g., a logical "1") to the programmed, high-resistance (typically greater than 100,000 Ohms) fuse state. The change in resistance is sensed (read) by a sensing circuit to produce a data bit.

FIG. 1B is a side view of the E-fuse 100 of FIG. 1A. The E-fuse 100 is fabricated from a layer of link material 101 that is deposited on the IC substrate and patterned using photolithographic techniques to define the anode 104, cathode 106, and fuse link 102. The fuse link 102 has a fuse link thickness $FL_T$ that is essentially the thickness of the layer of link material 101. The E-fuse is on field oxide 108 that is formed on semiconductor material 110 (e.g., silicon).

E-fuse elements are particularly useful due to their simplicity, low manufacturing cost, and easy integration into CMOS ICs using conventional CMOS fabrication techniques. However, incorrect programming can result in improperly programmed bits, and correct programming is critical in obtaining high programming yield. It is desirable to provide E-fuses that are more reliably programmed than those of the prior art.

SUMMARY OF THE INVENTION

An electronic fuse ("E-fuse") cell is formed on a semiconductor substrate. The E-fuse cell has a fuse element with a fuse link extending from a first fuse terminal across a thick dielectric structure to a second fuse terminal. The first and second fuse terminals are separated from the substrate by a thin dielectric layer.

DETAILED DESCRIPTION OF THE DRAWINGS

Figure 1A:
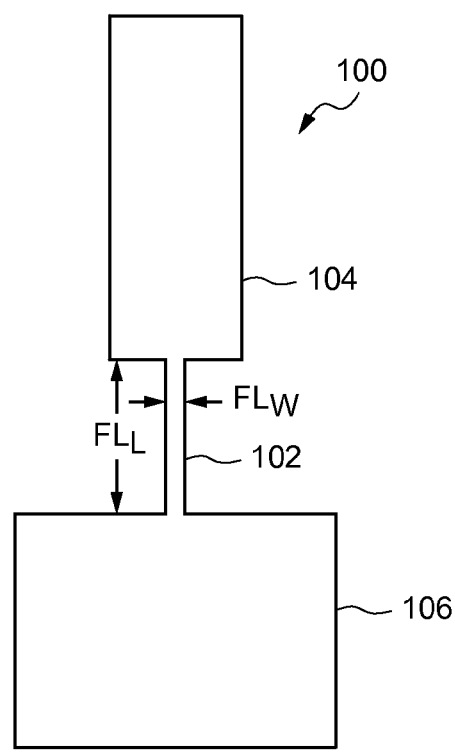
FIG. 1A is a plan view of a prior art E-fuse.
Figure 1B:
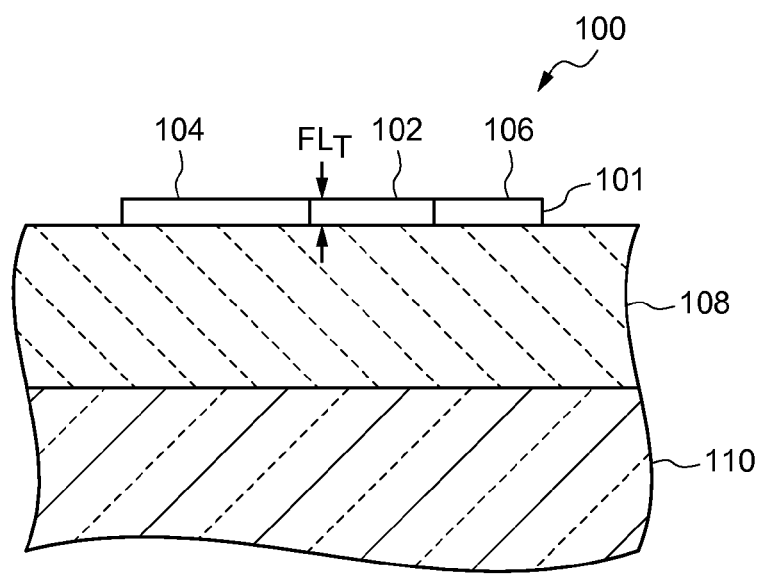
FIG. 1B is a side view of the E-fuse of FIG. 1A.
Figure 2A:
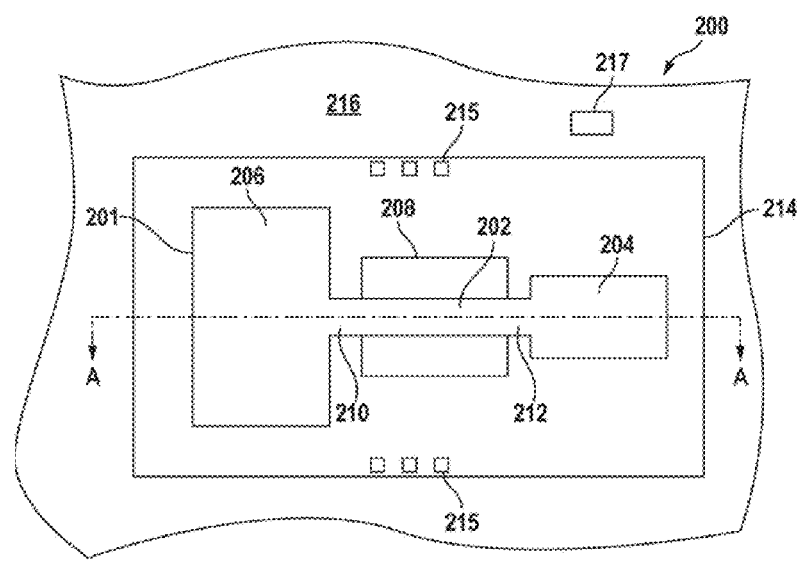
FIG. 2A is a plan view of an E-fuse cell according to an embodiment.

FIG. 2A is a plan view of an E-fuse cell 200 according to an embodiment. The E-fuse cell 200 has a fuse link 202 extending between a first fuse terminal (anode) 204 and a second fuse terminal (cathode) 206. The first and second fuse terminals 204, 206 are fabricated on thin oxide above active semiconductor (e.g., silicon), while the fuse link 202 extends across a thick dielectric structure 208, such as field oxide or shallow trench isolation ("STI") oxide. For purposes of convenient discussion, the fuse terminals and link will be referred to as the "fuse element" 201, and "active semiconductor" is used in the manner consistent with transistor cells, namely, a diffusion region or otherwise doped region in which transistors are formed (in contrast to an isolation region, for example).

End portions 210, 212 of the fuse link 202 also extend across thin oxide and semiconductor. The fuse terminals and fuse link are typically fabricated from a layer of polysilicon, silicided polysilicon, or other fuse material. In the standard EM mode E-fuse programming model, dopant migration takes place after silicide is removed, at least partially, from the link. Dopant migration is an important element to render high post-program resistance in silicide E-fuses. In a particular embodiment, the thin oxide is a gate oxide formed as part of a CMOS fabrication sequence of MOS FETs, and is the same material and thickness of the gate oxide (gate dielectric) of a FET in a CMOS IC. The thin oxide provides better thermal coupling of the overlying fuse structures to the relatively thermally conductive semiconductor. The thick dielectric 208 provides a greater degree of thermal insulation of the portion of the fuse link 202 between the end portions 210, 212. The thick dielectric structure acts in cooperation with the thin oxide during programming of the fuse cell to enhance the thermal gradient formed between the center of the fuse link and the ends of the fuse element during programming, compared to a fuse element on a dielectric layer of constant thickness.

Some ICs, such as field programmable gate arrays ("FPGAs"), have more than one type of MOS FET, and have more than one gate oxide thickness, depending on the type of MOS FET being fabricated. In a particular embodiment, the thin oxide separating the fuse structure (fuse terminals and fuse link) from the underlying semiconductor is about 10 Angstroms to about 100 Angstroms thick.

The thick dielectric is typically at least ten times thicker than the thin oxide, which thermally insulates the center portion of the fuse link relative to the end portions of the fuse link and the fuse terminals. In one embodiment, the thermal conductivity between a layer of polysilicon suitable for forming a fuse and underlying thin oxide/silicon is about 1.5 Watts per cm-K°, and the thermal conductivity between the layer of polysilicon on thick oxide is about 0.014 Watts per cm-K°. In some embodiments, thermal sinking of the fuse terminals and end portions of the fuse link is greater than ten times better than the thermal sinking of the middle of the fuse link. In further embodiments thermal sinking of the fuse terminals and end portions of the fuse link is greater than one hundred times better than the thermal sinking of the middle of the fuse link. Typical E-fuse link width ranges from about 40 nanometers ("nm") to about 150 nm and typical E-fuse length ranges from about 0.5 microns to about 1.5 microns. Electrodes are of about 1 um linear dimension.

In a particular embodiment, the thick dielectric is about 3,000 Angstroms to about 5,000 Angstroms thick. In a particular embodiment, the thick dielectric is field oxide used in FETs of a CMOS IC. Alternatively, the thick dielectric is trench isolation oxide or other oxide used in a standard CMOS IC fabrication sequence. Thus, embodiments of the invention are incorporated into standard CMOS fabrication sequences, or alternative embodiments are fabricated using other fabrication techniques.

One of the key reactions during programming of a polysilicon fuse link is local heating of the polysilicon, which drives conducting dopant species away from the hotter portions of the polysilicon (e.g., the center of the fuse link). According to an estimation, fuse link temperature can reach around 1000° C. during program. The higher thermal isolation of the middle portion of the fuse link creates a greater thermal gradient between the middle portion and the fuse terminals during fuse programming that facilitates driving conducting dopant species in polysilicon or silicide fuse material from the center of the fuse link towards the end(s) of the fuse link. Formation of the desired thermal gradient is facilitated by the relatively large areas of the fuse terminals that are thermally coupled through the thin oxide layer to the underlying semiconductor material, which is significantly more thermally conductive than the thick dielectric underlying the center portion of the fuse link. The relatively large fuse electrodes also provide a heat reservoir to extract Joule heat generated primarily in the fuse link due to current crowding.

After successful programming, the fuse material cools with a less conductive path between the fuse terminals. The fuse resistance (programmed state or bit value) is sensed by a sensing circuit, as is known in the art of E-fuse memory array design and operation.

In a particular embodiment, the fuse terminals 204, 206 are formed on thin dielectric above P-type active silicon 214 in an N-well 216. Alternatively, N-type active silicon could be formed in a P-well, or other combinations of semiconductor types could be used. Other diffusion shapes can be used too. For example, instead of forming a "doughnut shape", two separate diffusion areas can be placed under anode and cathode respectively, as shown in FIG. 3. The fuse element is defined prior to the P+ implant, and masks the portion of the N-well underlying the polysilicon or silicide fuse element from the implant. Thus, the silicon directly beneath the fuse element is N-type in this example. Fuse cells are alternatively formed in P-type wells, or even on the native silicon substrate with either thin/thick gate oxide or even relatively thin field oxide in combination with thicker oxide (e.g. STI oxide) underneath the fuse link. In yet another embodiment, an N-type implant in an N-well is used to form an active region (e.g., similar to P-type active region 214 in FIG. 2A or active regions 314, 315 in FIG. 3). This eliminates the P+ to N-well junction while forming an N-well to P-substrate junction, which isolates fuse electrodes from the substrate in the event of thin oxide breakdown. Without the P-N junction, dielectric breakdown in the thin oxide (see FIG. 2B, ref. num. 232) could provide a current leakage path from the fuse element (e.g. a fuse terminal) to the substrate.

A well tap 217 provides electrical connectivity to the N-well 216, and contacts 215 provide electrical connectivity to the P-type active silicon 214. The well tap 217 and contacts 215 allow biasing of the different types of silicon, and allow measurement of leakage current flow between the fuse and either P-active or N-well silicon. For example, leakage current can be measured before and after programming to determine whether damage to the thin oxide occurred during programming. Greater leakage current after a programming operation can be used to indicate that programming of the cell was attempted. If the programmed fuse fails its programmed resistivity specification, the leakage current data can be used to flag a failed programming process, or to indicate the correct (i.e., programmed or unprogrammed) bit value of the cell. Such techniques are discussed in further detail in commonly owned U.S. patent application Ser. No. 11/799,886, entitled "E-Fuse with Scalable Filament Link" filed on May 2, 2007, by Lakhbeer Sidhu et al. and in commonly owned U.S. patent Application, entitled "Integrated Circuit with MOSFET Fuse Element", filed on the date hereof by Hsung Jai Im et al., the disclosures of which are hereby incorporated in their entirety for all purposes.

Figure 2B:
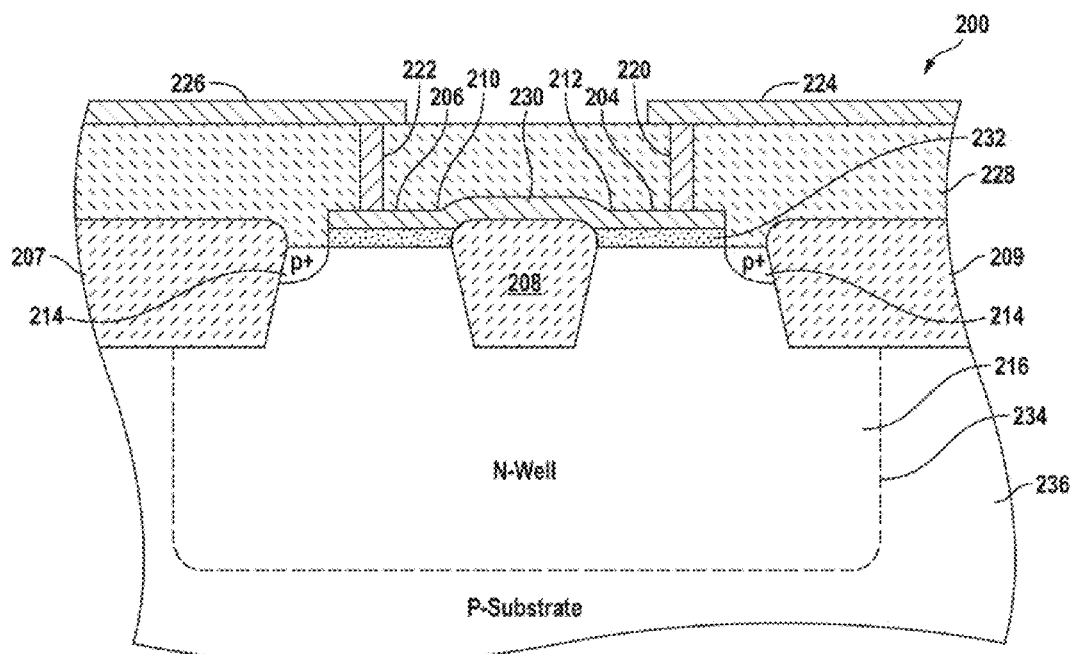
FIG. 2B is a cross section of the E-fuse cell of FIG. 2A.
Figure 3:
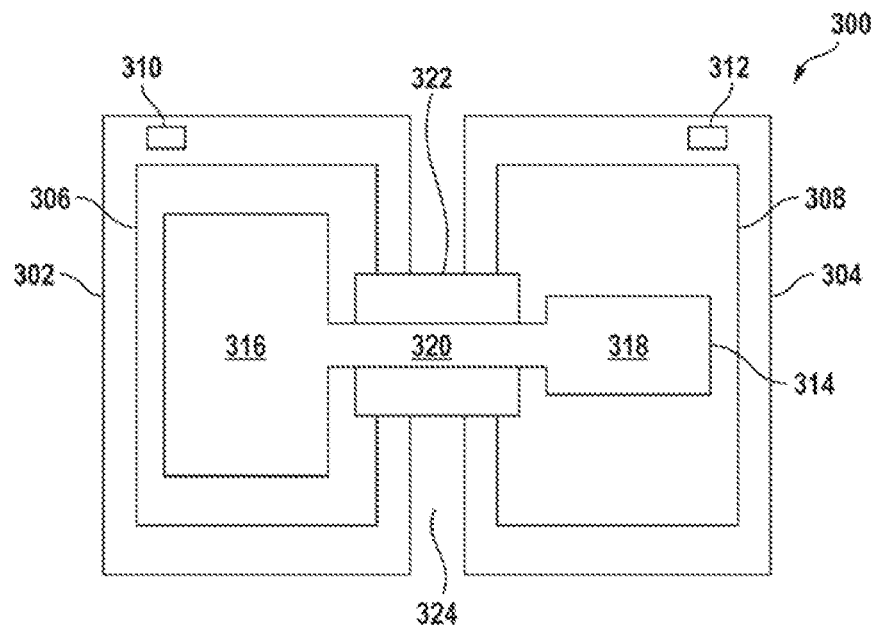
FIG. 3 is a plan view of an E-fuse cell 300 according to another embodiment.

FIG. 2B is a cross section of the E-fuse cell 200 of FIG. 2A taken across section line A-A and showing additional layers above the section line A-A in FIG. 2A. In particular, contacts 220, 222 extend from patterned metal lines (traces) 224, 226 through an inter-layer dielectric 228 to the anode 204 and cathode 206 of the. The fuse link has a center (middle) portion 230 and end portions 210, 212. The center portion 230 of the fuse link overlies the thick dielectric 208, which in this example is shallow trench isolation ("STI") dielectric. Additional STI structures 207, 209 isolate the p+ region(s) 214.

These STI structures 207, 209 are underneath the inter-layer dielectric 228 and may be of the same material (e.g., silicon dioxide).

The fuse terminals 204, 206 are separated from semiconductor, which in this case is P-type active silicon 214 in an N-well 216 by a thin dielectric layer 232. In a particular embodiment, the thin dielectric layer is an oxide layer grown from the underlying silicon concurrently with gate oxide layers in a CMOS fabrication process. Alternatively, a thin dielectric layer is formed by other techniques, such as deposition, and is alternative material, such as oxy-nitride or nitride.

The thin dielectric layer 232 electrically isolates the fuse terminals 204, 206 from the underlying active silicon. Normally, the leakage current from the fuse terminals to the silicon is very small. If the oxide is damaged, either during fabrication or as a result of fuse programming, this leakage current can be measured and compared to a pristine or an expected leakage current value to determine if the cell was improperly fabricated, or used as an additional or alternative technique to determine whether the cell was programmed. The latter is particularly desirable to determine whether the fuse programming conditions produce reliably programmed fuse links.

The P-type active silicon is formed by ion implantation or other suitable method, and surrounds the fuse element. The P-type silicon 214 and the N-well silicon 216 form a PN junction at the interface. The N-well silicon 216 forms another PN junction (dashed line 234) with the P-substrate 236. The well-to-substrate PN junction isolates the polysilicon fuse from the substrate during programming, even if damage to the underlying thin dielectric layer 232 occurs. Similarly, the PN junction isolates the fuse from the substrate during a READ operation. High leakage current from a fuse terminal to the substrate might be interpreted as a low-resistance fuse link during a READ operation, resulting in a false data bit being read. Conventional fuses that are fabricated on thick oxide avoid this because the thick oxide electrically isolates the fuse terminals and fuse link from the underlying silicon and is highly unlikely to be damaged during fuse programming to the point where leakage current to the substrate would develop. However, the thick oxide also thermally insulates the fuse terminals to the substrate, making it more difficult to develop a high thermal gradient between the center of the fuse link and the fuse terminals. The thin dielectric layer 232 is typically grown on or from the silicon, and, in a typical fabrication sequence, is etched away from areas that are not covered by the polysilicon or silicide. Thus, the thin dielectric layer 232 lies between the fuse element and silicon, except for where the fuse link crosses the thick dielectric 208.

FIG. 3 is a plan view of an E-fuse cell 300 according to another embodiment. The E-fuse cell 300 has two wells 302, 304 (e.g., two N-wells formed in a P-type substrate) and two active regions 306, 308 (e.g., P+ regions in N-wells). Even if simultaneous thin oxide breakdown under both the anode and the cathode occurs during fuse programming, the two terminals remain electrically isolated. Well taps 310, 312 are provided for each well 302, 304, which allows separately biasing each well independently to measure leakage current from the overlying fuse element 314. In other words, if the thin oxide underlying the fuse element is damaged during a programming operation, the user can determine whether the leakage current is arising at the anode or the cathode of the fuse element. The fuse element 314 has fuse terminals 316, 318 and a fuse link 320 extending between the fuse terminals 316, 318. The fuse element 314 is similar to the fuse element described in reference to FIGS. 2A and 2B, and a detailed discussion is therefore omitted. A gap 324 between the wells 302, 304 isolates the wells from each other.

The active silicon 306 acts in cooperation with thick oxide 322 to surround the fuse terminal 316 to electrically isolate leakage current from the fuse terminal 316 from the second well 304, and vice versa. The active silicon establishes a PN junction with the well that partially surrounds the fuse terminal. The thick oxide 322 completes the perimeter to provide electrical isolation. Alternatively, the well is omitted, and an active region establishes a PN junction with the substrate silicon.

Figure 4:
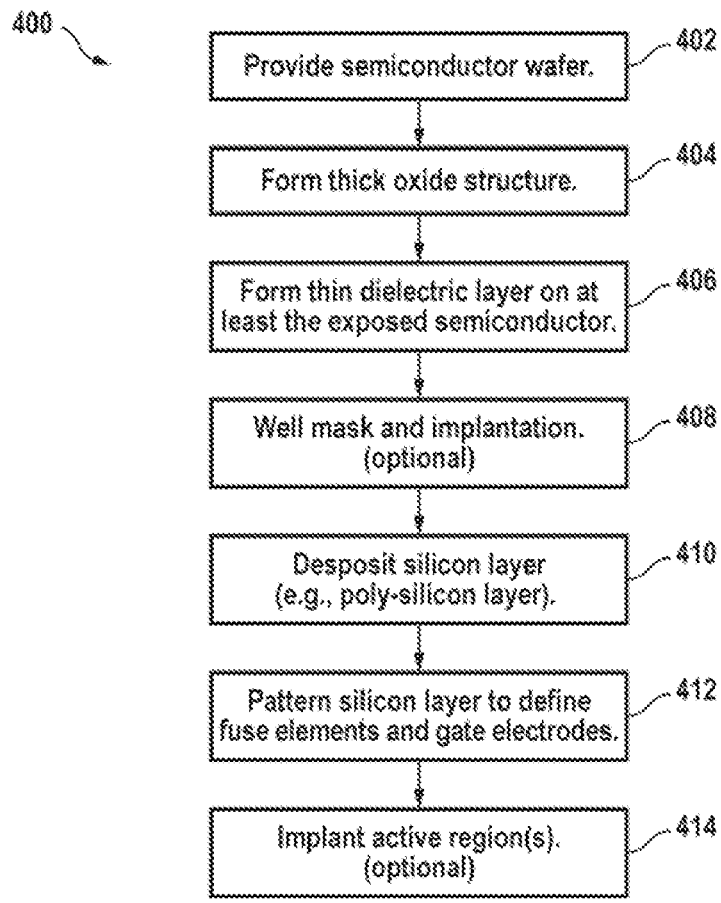
FIG. 4 is a flow chart of a method of fabricating an IC according to an embodiment.

FIG. 4 is a flow chart of a method of fabricating an IC 400 according to an embodiment. In a particular embodiment, the IC is a CMOS IC and the method is a CMOS fabrication method having a gate dielectric process, an active silicon doping process and a polysilicon gate process. A semiconductor wafer is provided (step 402). In a particular embodiment, the semiconductor wafer is a silicon wafer or a wafer having a silicon surface. The semiconductor wafer usually has a first conductivity type, for example, a P-type silicon wafer. A thick oxide step is performed to provide a thick dielectric field structure (step 404). In a particular embodiment, the thick oxide step is STI oxide formed in previously formed trenches, and the thick dielectric field structure is a STI structure that partitions the wafer into cells.

A gate dielectric layer is formed on exposed silicon (step 406). In a particular embodiment, the gate dielectric layer is a silicon-oxide-based layer less than 100 Angstroms thick, which will provide relatively good thermal conductivity between a fuse terminal formed in subsequent steps and the underlying silicon. In a particular embodiment, the gate dielectric layer is a silicon oxide layer grown from underlying silicon. The wafer is masked using well-known photolithographic techniques, and a well implantation is performed through the gate dielectric layer to create wells in selected areas of the semiconductor wafer (step 408). In an alternative sequence, the well implantation precedes the formation of the gate oxide layer. In a particular embodiment, the well is of the opposite of the conductivity type than the substrate. In an exemplary embodiment, additional wells are formed in which transistors will be fabricated.

A silicon layer is deposited on the gate dielectric layer (step 410). The silicon layer is amorphous or polysilicon, for example, and is optionally silicided in a subsequent process step. The silicon layer is patterned (step 412) to form a fuse element in a first cell and to form a gate of a transistor in a second cell. The fuse element includes a fuse link extending between fuse terminals. The fuse link crosses over the thick dielectric field, which provides high thermal isolation between that portion of the fuse link and the silicon substrate. Gate dielectric that is not covered by the patterned silicon layer is typically stripped from the wafer in a subsequent step (not shown). An active region implantation is performed to form active silicon regions (step 414) in the fuse cell and in the transistor cell (i.e., source and drain regions). In a particular embodiment, an active silicon region within the well surrounds the fuse element in the fuse cell.

In the E-fuse cell, the well of the first conductivity type forms a PN junction with the substrate of the second conductivity type. In an alternative embodiment, the active area implant is omitted from the fuse cell. In another embodiment, a well is not formed in the fuse cell. Several alternative techniques for fabricating E-fuse cells according to embodiments may become apparent to those of skill in the art of CMOS fabrication. Therefore, the method described above is merely exemplary.

Figure 5:
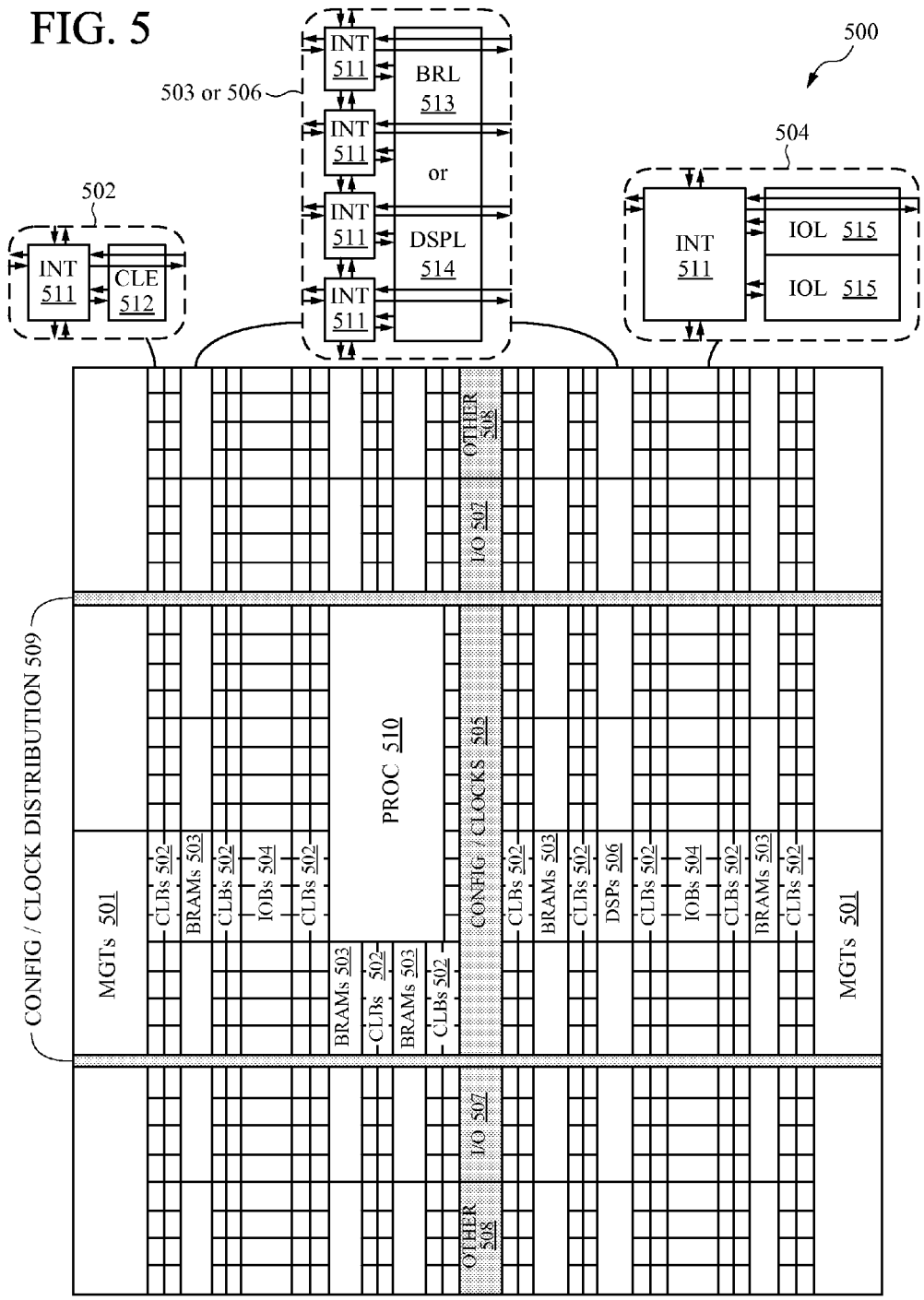
FIG. 5 is a plan view of an FPGA according to an embodiment.

FIG. 5 is a plan view of an FPGA according to an embodiment. The FPGA includes CMOS portions in several of the functional blocks, such as in RAM and logic, and is fabricated using a CMOS fabrication process. MOS fuses programmed according to one or more embodiments of the invention are incorporated in any of several functional blocks of the IC, such as a memory block, logic block, I/O block, clock circuit, transceiver, or other functional block; within many functional blocks; or within a physical section or segment of the FPGA 500. The FPGA also has at least one E-fuse cell according to an embodiment. In a further embodiment, the FPGA has a variety of types of E-fuse cells (e.g., different memory arrays use different types of E-fuse cells).

E-fuses programmed according to one or more embodiments of the invention are particularly desirable for non-reconfigurable, NV memory applications, such as serial numbers, storing security bits that disable selected internal functions of the FPGA, repair information for blocks with redundancy, bit-stream encryption key storage, or to provide a user general-purpose one-time programmable NV user-defined bit storage.

The FPGA architecture includes a large number of different programmable tiles including multi-gigabit transceivers (MGTs 601), configurable logic blocks (CLBs 502), random access memory blocks (BRAMs 503), input/output blocks (IOBs 504), configuration and clocking logic (CONFIG/CLOCKS 505), digital signal processing blocks (DSPs 506), specialized input/output blocks (I/O 507) (e.g., configuration ports and clock ports), and other programmable logic 508 such as digital clock managers, analog-to-digital converters, system monitoring logic, and so forth. Some FPGAs also include dedicated processor blocks (PROC 510).

In some FPGAs, each programmable tile includes a programmable interconnect element (INT 511) having standardized connections to and from a corresponding interconnect element in each adjacent tile. Therefore, the programmable interconnect elements taken together implement the programmable interconnect structure for the illustrated FPGA. The programmable interconnect element (INT 511) also includes the connections to and from the programmable logic element within the same tile, as shown by the examples included at the top of FIG. 5.

For example, a CLB 502 can include a configurable logic element (CLE 512) that can be programmed to implement user logic plus a single programmable interconnect element (INT 511). A BRAM 503 can include a BRAM logic element (BRL 513) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 506 can include a DSP logic element (DSPL 514) in addition to an appropriate number of programmable interconnect elements. An 10B 504 can include, for example, two instances of an input/output logic element (IOL 515) in addition to one instance of the programmable interconnect element (INT 511). As will be clear to those of skill in the art, the actual I/O pads connected, for example, to the I/O logic element 515 are manufactured using metal layered above the various illustrated logic blocks, and typically are not confined to the area of the input/output logic element 515. In the pictured embodiment, a columnar area near the center of the die (shown shaded in FIG. 5) is used for configuration, clock, and other control logic.

Some FPGAs utilizing the architecture illustrated in FIG. 5 include additional logic blocks that disrupt the regular columnar structure making up a large part of the FPGA. The additional logic blocks can be programmable blocks and/or dedicated logic. For example, the processor block PROC 510 shown in FIG. 5 spans several columns of CLBs and BRAMs.

Note that FIG. 5 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 5 are purely exemplary. For example, in an actual FPGA more than one adjacent column of CLBs is typically included wherever the CLBs appear, to facilitate the efficient implementation of user logic.

While the present invention has been described in connection with specific embodiments, variations of these embodiments will be obvious to those of ordinary skill in the art. For example, alternative layouts and cross-sections of E-fuses could be alternatively used, and alternative sensing circuitry can be used. Therefore, the spirit and scope of the appended claims should not be limited to the foregoing description.

The invention claimed is:

1. An electronic fuse ("E-fuse") cell comprising:
   a semiconductor substrate;
   a thick dielectric structure;
   a thin dielectric layer formed on the semiconductor substrate;
   a layer of link material disposed directly on the thin dielectric layer and directly on and extending over the thick dielectric structure; and
   a fuse element of the link material having a first fuse terminal of the link material, a second fuse terminal of the link material, and a fuse link of the link material extending from the first fuse terminal to the second fuse terminal across the thick dielectric structure, the first fuse terminal and the second fuse terminal being separated from the semiconductor substrate by the thin dielectric layer.

2. The E-fuse cell of claim 1 wherein the thick dielectric structure is a shallow trench isolation dielectric structure.

3. The E-fuse cell of claim 1 wherein the thick dielectric structure is at least thirty times thicker than the thin dielectric layer.

4. The E-fuse cell of claim 1 wherein the thin dielectric layer is not more than 100 Angstroms thick.

5. The E-fuse cell of claim 1 wherein the thin dielectric layer provides a first thermal conductivity from the first fuse terminal and the thick dielectric field provides a second thermal conductivity from at least a center portion of the fuse link, the first thermal conductivity being at least ten times greater than the second thermal conductivity.

6. The E-fuse cell of claim 1 wherein the E-fuse cell stores a bit of a serial number, a security code disabling a selected internal function, a bit-stream encryption key, block repair information, or user-defined value in a field programmable gate array.

7. The E-fuse cell of claim 1 wherein the fuse link is disposed on the thick dielectric structure.

8. The E-fuse cell of claim 1 wherein the fuse element is formed from a polysilicon layer.

9. The E-fuse cell of claim 8 wherein the E-fuse cell is incorporated in an integrated circuit having a field effect transistor with a gate electrode formed from the polysilicon layer disposed on the thin dielectric layer.

10. The E-fuse cell of claim 1 wherein the semiconductor is a first conductivity type and further comprising a well of a second conductivity type formed in the semiconductor substrate and a well tap providing electrical connection to the well, at least the first fuse terminal being separated from the well by the thin dielectric layer.

11. The E-fuse cell of claim 10 wherein the well underlies the fuse element, and further comprising an active region of the first conductivity type formed in the well, the active region surrounding the fuse element.

12. The E-fuse cell of claim 11 wherein the well and the active region comprise silicon and the thin dielectric layer comprises silicon oxide.

13. The E-fuse cell of claim 10 further comprising a second well, the second fuse terminal being separated from the second well by the thin dielectric layer and the second well being separated from the well by a gap.

14. The E-fuse cell of claim 13 further comprising a first active area formed in the well and a second active area formed in the second well.

15. A method of fabricating an electronic fuse ("E-fuse") cell comprising:
   providing a semiconductor wafer of a first conductivity type;
   forming a thick dielectric structure;
   forming a thin dielectric layer on the semiconductor wafer;
   depositing a silicon layer directly on the thick dielectric structure and directly on the thin dielectric layer; and
   patterning the silicon layer so as to define a fuse element having a first terminal, a second terminal, and a fuse link, the fuse link extending from the first terminal across the thick dielectric structure to the second terminal, the first terminal and the second terminal being separated from the semiconductor wafer by the thin dielectric layer.

16. The method of claim 15 wherein the thick dielectric structure provides a first thermal conductivity from a center portion of the fuse link and the thin dielectric layer provides a second thermal conductivity from the first fuse terminal, the second thermal conductivity being at least ten times greater than the first thermal conductivity.

17. The method of claim 15 further comprising a step, prior to the step of depositing the silicon layer, of forming at least one well in a fuse cell of the integrated circuit.

18. The method of claim 17 wherein the well surrounds the fuse element.

19. The method of claim 17 further comprising a step, after the step of patterning the silicon layer, of forming at least one active silicon region within the well.

20. The method of claim 19 wherein the active silicon region surrounds the fuse element.

* * * * *